United States Patent
Kohavi et al.

(10) Patent No.: US 9,734,263 B2
(45) Date of Patent: Aug. 15, 2017

(54) METHOD AND APPARATUS FOR EFFICIENT PRE-SILICON DEBUG

(71) Applicant: Intel Corporation, Santa Clara, CA (US)

(72) Inventors: Erez Kohavi, Haifa (IL); Evgeniy Ainbinder, Haifa (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/721,790

(22) Filed: Dec. 20, 2012

(65) Prior Publication Data

US 2014/0181767 A1 Jun. 26, 2014

(51) Int. Cl.
*G06F 17/50* (2006.01)

(52) U.S. Cl.
CPC .......... *G06F 17/50* (2013.01); *G06F 17/5081* (2013.01)

(58) Field of Classification Search
CPC ..................................................... G06F 17/50
USPC ........................................................ 716/100
See application file for complete search history.

(56) References Cited

U.S. PATENT DOCUMENTS

| | | | | |
|---|---|---|---|---|
| 6,477,683 B1* | 11/2002 | Killian et al. | ................ | 716/106 |
| 6,678,645 B1* | 1/2004 | Rajsuman et al. | ............... | 703/20 |
| 7,168,060 B2* | 1/2007 | Matsumoto et al. | ......... | 716/102 |
| 7,458,043 B1* | 11/2008 | Cischke et al. | ............... | 716/106 |
| 7,478,028 B2* | 1/2009 | Ho et al. | ......................... | 703/14 |
| 8,229,723 B2* | 7/2012 | Srinivasan et al. | ............ | 703/14 |
| 8,381,037 B2* | 2/2013 | DeWitt et al. | ............. | 714/38.13 |
| 8,656,368 B1* | 2/2014 | Ovadia | ............... | G06F 11/3466 |
| | | | | 714/38.1 |
| 8,689,190 B2* | 4/2014 | DeWitt et al. | ................ | 717/127 |
| 2003/0216901 A1* | 11/2003 | Schaumont et al. | ........... | 703/13 |
| 2009/0030666 A1* | 1/2009 | Van Huben et al. | .......... | 703/16 |
| 2009/0313001 A1* | 12/2009 | Kato et al. | ...................... | 703/15 |

\* cited by examiner

*Primary Examiner* — Thuan Do
(74) *Attorney, Agent, or Firm* — Blakely, Sokoloff, Taylor & Zafman LLP (57) ABSTRACT

Described is a method and apparatus for efficient pre-silicon validation of an integrated circuit. The method comprises: analyzing an architectural verification environment associated with a hardware description language (HDL) architecture of an integrated circuit, recognizing method calls associated with the architectural verification environment, and generating a list of recognized method calls that is loaded for a debug program to debug the HDL architecture of the integrated circuit.

20 Claims, 7 Drawing Sheets

```
300 extend my_struct1_s {
    my_first_method(u1 : uint, s1 : string) : bool is first {
        ...
    };
    my_first_method(u1 : uint, s1 : string) : bool is also {
        ...
    };
    my_second_method(u2 :uint, s2 : string) :uint is first {
        ...
    };
    my_second_method(u2 :uint, s2 : string) :uint is also {
        ...
    };
};

extend my_struct2_s {
    ...
};

extend my_struct3_s {
    ...
};
```

METHOD AND APPARATUS FOR EFFICIENT PRE-SILICON DEBUG

BACKGROUND

Debugging tests or regression reports for logic designed in hardware description language (HDL) is a cumbersome process. Ability to trace method calls, event occurrences, or threads during test is valuable to debug the tests of regression reports. This kind of information can significantly shorten debug time throughout the pre-silicon verification stage. Presently, to know when or if a specific event occurred or a method was called, what the input parameters and the return value were, and who called the method, the tools are fully dependent on the existing messages written in the test code (and their verbosity) or on the usage of debugger breakpoints.

The use of messages within the test code has several disadvantages. For example, too many messages make the log file unreadable. Another disadvantage is that the quality of message depends on whether the programmer of the test code put an informative message in the method/event. Messages usually don't show internal fields values of structs, unless the debugging tool is run in interactive mode or each subfield of the struct is written separately. Another disadvantage of the use of message for debugging is that the log messages are hard to comprehend and complex to assist in determining where in the environment structure or environment code the message is located. Likewise, use of message does not inform which thread started and where or when it started.

The optional solution to the above problem is to put breakpoints throughout the code, and rerun and start debugging the code step by step or through the thread browser. This optional solution has its disadvantages. For example, debugging the code step by step via breakpoints is relevant only in interactive mode (not in regression). The optional solution requires that the test be rerun, which may waste precious time. Another disadvantage of the optional solution is that knowledge of interesting break points needs to be determined in advance, which is not always possible. For example, many times a breakpoint is placed and the code is rerun, only to find out it was the wrong place in the code to place the breakpoint and that the event of interest was missed altogether.

Another option to solving the above problem is to add debug messages to the code. This solution also has its disadvantages. For example, this solution requires knowledge beforehand about where possible problem methods are and to place debug messages for those methods. Sometimes the verification environment code (or HVL code) is locked to debuggers, and so write permissions are needed to add debug messages to the verification environment code. Another disadvantage is that the test needs to be rerun. As discussed above, too many debug messages make the log (or log file) unreadable.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

One commercially available tool for verifying HDL code is Specman® by Cadence Design Systems, Inc. of California. Specman® is a tool that executes 'e' verification language as defined by Institute of Electrical and Electronics Engineers (IEEE) 1647. Specman® is an EDA (Electronics Design Automation) tool to provide advanced automated functional verification of hardware designs. Specman® provides an environment for working with, compiling, and debugging test-bench environments written in the 'e' hardware verification language (HVL). Specman® also offers automated test-bench generation to boost productivity in the context of block, chip, and system verification.

The 'e' language is a HVL, as defined by Institute of Electrical and Electronics Engineers (IEEE) 1647, which is tailored to implementing highly flexible and reusable verification test-benches. The 'e' language uses an aspect-oriented programming (AOP) approach, which is an extension of the object-oriented programming (OOP) approach to address the needs required in functional verification. AOP is a key feature in that it allows for users to easily bolt on additional functionality to existing code in a non-invasive manner. However, current tools lack the automatic pre-silicon validation capability to trace methods calls, events occurrences, parameter values, results, or threads, etc. during test.

The embodiments describe a solution to automatically generate a methods_extend.e file which logs all the needed complementary data. Examples of complementary data (or information) include: when or if a specific event occurred or a method was called; when did a time consuming method end (e.g., when rerun( ) is called—the method is considered as "never ended method" unless the rerun( ) is called in the last tick of the method); what were the input parameters and the return value (the return value is shown both when using return <return_value> and result=<return_value>); who called the method; full thread description; method's first declaration in the code (currently, further method's extensions are not shown).

In one embodiment, complementary data is logged into a separate log. In one embodiment, this separate log can be reviewed using a dedicated Graphical User Interface (GUI). There are many technical effects of the embodiments. Some non-limiting technical effects include: regular log is not polluted with too much information; extra data is collected on the original run i.e., no rerun is needed; the extra data is available on both batch and interactive modes, and can be used also in debugging regression results; the solution works on compiled code; the solution is fully automated and available using a simple flag. The embodiments describe the implementation principles, architecture, GUI tool, and use cases.

While the embodiments are described with reference to Specman®, other EDA tools with similar capabilities as Specman® can be used. Furthermore, the embodiments are not limited to the 'e' HVL, other HVL with capabilities similar to 'e' HVL may be used.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected, or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a", "an", and "the" include plural references. The meaning of "in" includes "in" and "on."

The terms "substantially," "close," "approximately," "near," "about," herein refer to being within +/−20% of a target value. As used herein, unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of this disclosure a module is a software, hardware, or firmware (or combinations thereof) system, process or functionality, or component thereof, that performs or facilitates the processes, features, and/or functions, functionalities and/or operations described in the embodiments (with or without human interaction or augmentation) as being performed by the identified module. A module can include sub-modules. Software components of a module may be stored on a tangible machine readable medium. Modules may be integral to one or more servers, or be loaded and executed by one or more servers. One or more modules may grouped into an engine or an application.

Figure 1:
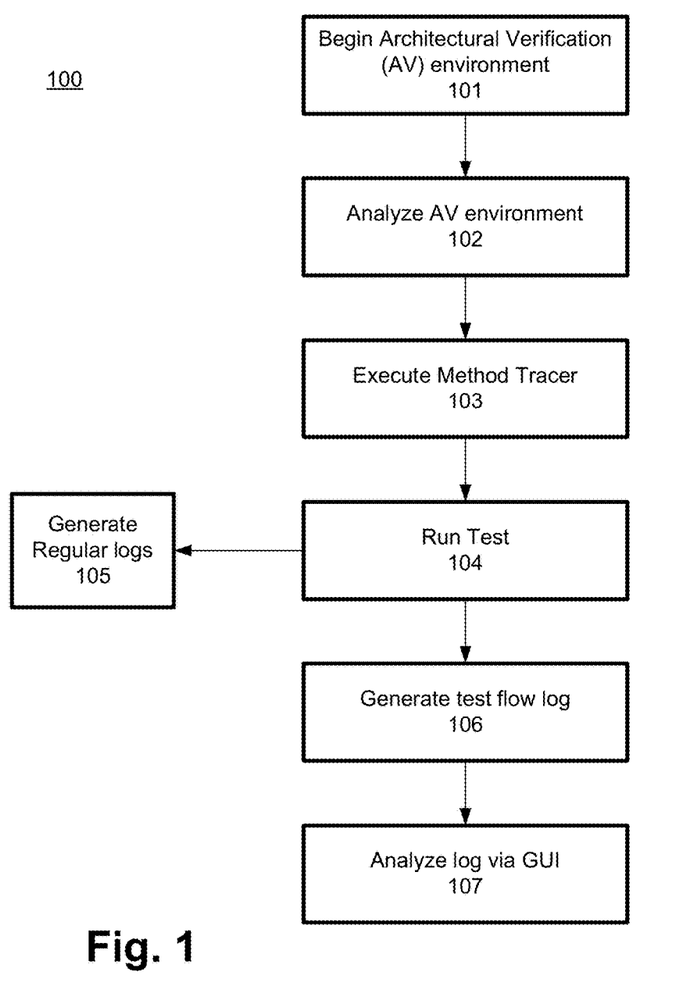
FIG. 1 illustrates a top level view of the pre-silicon validation system method, according to one embodiment.

FIG. 1 illustrates a top level view 100 of pre-silicon validation system method, according to one embodiment. Although the blocks in the flowchart with reference to FIG. 1 are shown in a particular order, the order of the actions can be modified. Thus, the illustrated embodiments can be performed in a different order, and some actions/blocks may be performed in parallel. Some of the blocks and/or operations listed in FIG. 1 are optional in accordance with certain embodiments. The numbering of the blocks presented is for the sake of clarity and is not intended to prescribe an order of operations in which the various blocks must occur. Additionally, operations from the various flows may be utilized in a variety of combinations.

At block 101, architectural verification environment is compiled. For example, all methods, events, sequences in the environment are recognized. At block 102, code for debugging is compiled. For example, an environment analyzing script is executed to identify the entire environment code structure including file loading order, ifdefs, and extensions of multiple structs. In one embodiment, a programmatic interface e.g., reflection (also called introspection), into the meta-data of the program is used. For example, reflection is used to access meta-level entities (which are generally type related), such as, classes, methods, fields, etc.

At block 103, extensions to methods are performed. For example, method extensions of all existing method and events in a struct or unit are collected in a file. In this block, visibility to method, structs, and units which were previously not attainable or was extremely cumbersome is created.

At block 104, the pre-silicon validation tool is executed and the test is run. At block 105, the traditional logs (regular logs) are generated for analyzing debug results. The regular logs may be used by previous tool flows without disruption. For example, logs (or log files) can be parsed by a regression tool (e.g., vmmanager tool by Cadence®), greped, or inspected using text editors. At block 106, new test flow tracer logs are generated according to the method tracer postloade performed at block 103. At block 107, a graphical user interface (GUI) is opened which displays the method tracer log file (i.e., log file generated by tracing methods) generated by block 106. The GUI provides complete debug analysis without having to rerun the tests to add new breakpoints or messages.

Figure 2:
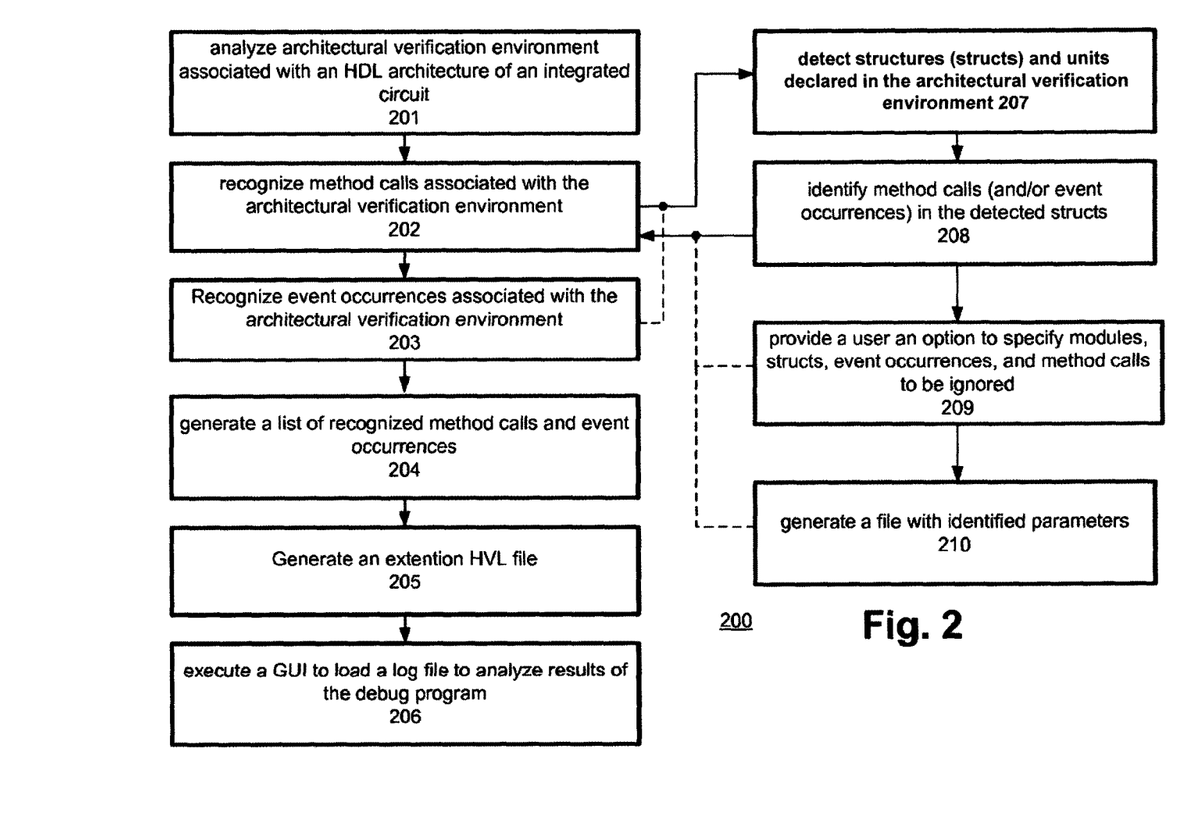
FIG. 2 is a detailed flowchart of pre-silicon validation, according to one embodiment.

FIG. 2 is a detailed flowchart of the pre-silicon validation system method of FIG. 1, according to one embodiment. It is pointed out that those elements of FIG. 2 having the same reference numbers (or names) as the elements of any other figure can operate or function in any manner similar to that described, but are not limited to such. FIG. 2 is described with reference to FIG. 1.

Although the blocks in the flowchart with reference to FIG. 2 are shown in a particular order, the order of the actions can be modified. Thus, the illustrated embodiments can be performed in a different order, and some actions/blocks may be performed in parallel. Some of the blocks and/or operations listed in FIG. 2 are optional in accordance with certain embodiments. The numbering of the blocks presented is for the sake of clarity and is not intended to prescribe an order of operations in which the various blocks must occur. Additionally, operations from the various flows may be utilized in a variety of combinations.

At block 201, the architectural verification environment is analyzed, where the architectural verification environment is associated with HDL architecture of an integrated circuit. The integrated circuit may be a complete microprocessor design or part of it. For example, it may be an execution unit of a processor core which is part of the processor. In one embodiment, HDL is one of: Verilog; VHDL; Analog HDL (AHDL); Verilog for Analog and Mixed Signal (Verilog-AMS); or VHDL with Analog and Mixed Signal Extension (VHDL-AMS). In one embodiment, at block 201, entire verification environment is loaded and compiled using flags and defines taken from a run command, test, and/or other configuration files.

At block 202, method calls associated with the architecture verification environment are recognized. In one embodiment, block 202 is executed by performing some or all blocks 207-210. At block 207, structs and units declared in the architectural environment are detected. At block 208, method calls in the detected structs are identified. At block 209, a file is generated with identified parameters. In one embodiment, recognizing method calls and parameters further comprises: identifying parameters, associated with the method calls, including at least one of: name; input parameters; result type; sampling event; containing thread; start and end time; source code link; or starter.

At block 203, event occurrences associated with the architecture verification environment are recognized. In one embodiment, block 203 is executed by performing some or all blocks 207-210.

At block 207, structs and units declared in the architectural environment are detected. At block 208, event occurrences in the detected structs are identified. At block 209, a user is provided an option to specify modules, structs, method calls, event occurrences, etc. to be ignored from the test. For example, private and encrypted modules which are not extendible are ignored. In one embodiment, generally occurring events such as clocks are automatically ignored during the run because clocks are predictable. At block 210, a file is generated with identified parameters.

At block 204, a list of recognized method calls and event occurrences is generated. Using this list, an extension HVL file is created. This file extends all the units and structs containing the methods and events from the list. The file is then loaded for the debug program. At block 205, an extension HVL file is generated using the list. In one embodiment, the extension HVL file extends all the units and structs containing the methods and events from the list. In one embodiment, the extension HVL file is then loaded for the debug program.

At block 206, GUI is opened to load the log file generated from the test run. The log file is used to analyze the results of the debug program via the GUI. In one embodiment, GUI is operable to provide at least one of: a tree of started threads with information about each thread and method call that ran by the debug program; a visual flow of a test executed by the debug program; a flow of each thread that ran by the debug program; information about multiple calls to a same method; information about threads or method calls that never ended; information about integrity checker methods which did not stop on reset resulting in false alarms; a search pane to find any method or event which occurred during execution of the debug program; or information about parameters of a method call made during execution of the debug program.

In one embodiment, information about parameters of a method call made during execution of the debug program include at least one of: full e-path; source reference of the method call; direct link to start of a thread making the method call; start time; end time; input parameters; or result.

For example, in one embodiment, environment top file is loaded and all the structs and units which are declared in the environment are detected by rf_manager.get_user_types( ). In one embodiment, a detect_methods.e file is created out of the list of structs/units. In such an embodiment, detect_methods.e file checks for each struct if it contains methods (events are also considered as methods) using the get_declared_methods( ) method. In one embodiment, the detect_methods.e file also prints all the interesting parameters of the methods, such as, name, input parameters, result type, tcm/non tcm, sampling event, containing unit, and source reference using the following rf_method reflections methods: is_inline( ), get_name( ), get_parameters( ), get_result_type( ), is_tcm( ), etc. The terms "TCM" or "tcm" refer to "Time Consuming Method." Some method are non-TCM methods because they start and end on the same simulation time.

In one embodiment, the detect_methods.e file is used to create the final methods_extend.e file which is loaded in the test run command (e.g., in postload). In one embodiment, the methods_extend.e file includes extension for each struct which contains methods. In one embodiment, each struct extension includes "is first"/"is also" method extensions with messages which inform the user all the method parameters generated on the detect methods stage, along with the current thread information which is generated during simulation using scheduler.current_thread field. In one embodiment, by default, Cadence® internal methods which cannot be extended (e.g., vr_ad methods) are ignored during the analysis process 201 and 202. Cadence® internal methods refer to built in methods provided by Cadence® in structs and/or units. In one embodiment, user is provided with an option to specify in a dedicated filter file modules, structs, and methods that should be ignored. In one embodiment, during analysis process 201 and 202, Cadence® internal methods such as body( ) method to trace sequences and dut_error methods (design under test methods) to trace design under test occurrences are not ignored.

Figure 3:
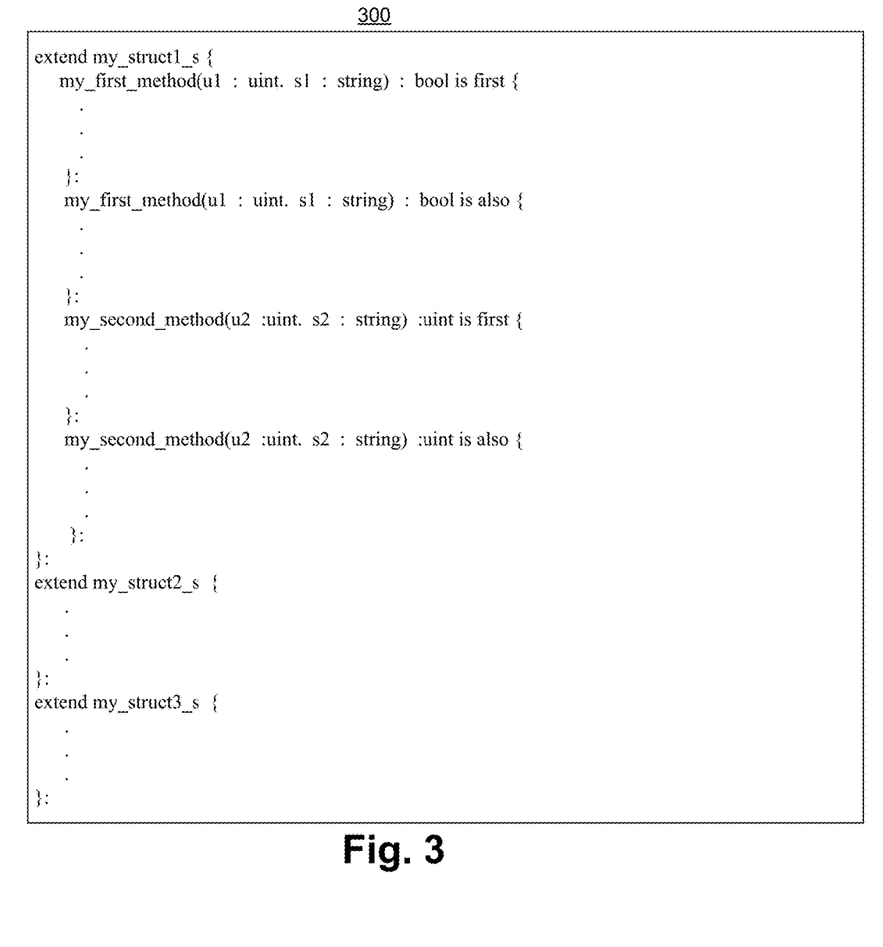
FIG. 3 is a methods extend file structure for pre-silicon validation, according to one embodiment.

FIG. 3 is a methods extend file structure 300 for pre-silicon validation, according to one embodiment. It is pointed out that those elements of FIG. 3 having the same reference numbers (or names) as the elements of any other figure can operate or function in any manner similar to that described, but are not limited to such.

In one embodiment, the final methods_extend.e file 300 is a collection of extensions to all existing structs/units in the design. In one embodiment, each extension includes methods extension of all existing methods/events in the struct/unit. In one embodiment, final methods_extend.e file 300 is a collection of structs and units extensions. In one embodiment, each struct/unit contains extension of the methods/events of the struct. For example my_struct1_s contains two methods—my_first_method and my_second_method. Each method is extended twice—one for the message on the beginning of the method (the "is first" extension) and one for the message on the end (the "is also" extension), as described in FIG. 4. In this example, my_struct2_s and the methods it contains, my_struct3_s and the methods it contains and so on are extended until all or most of the existing structs/units in the verification environment and their contained methods/events are extended.

Figure 4:
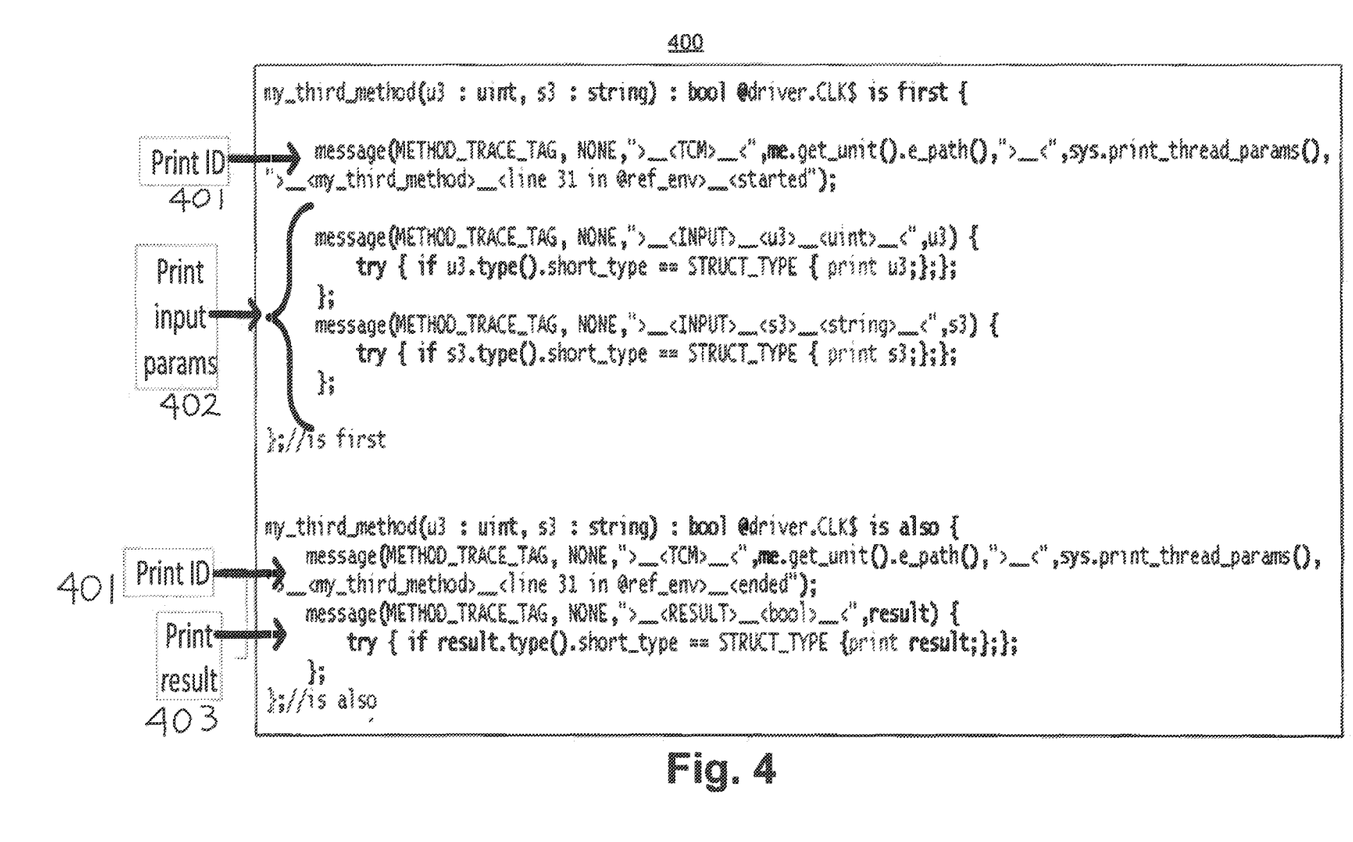
FIG. 4 is a method extension for pre-silicon validation, according to one embodiment.
Figure 5:
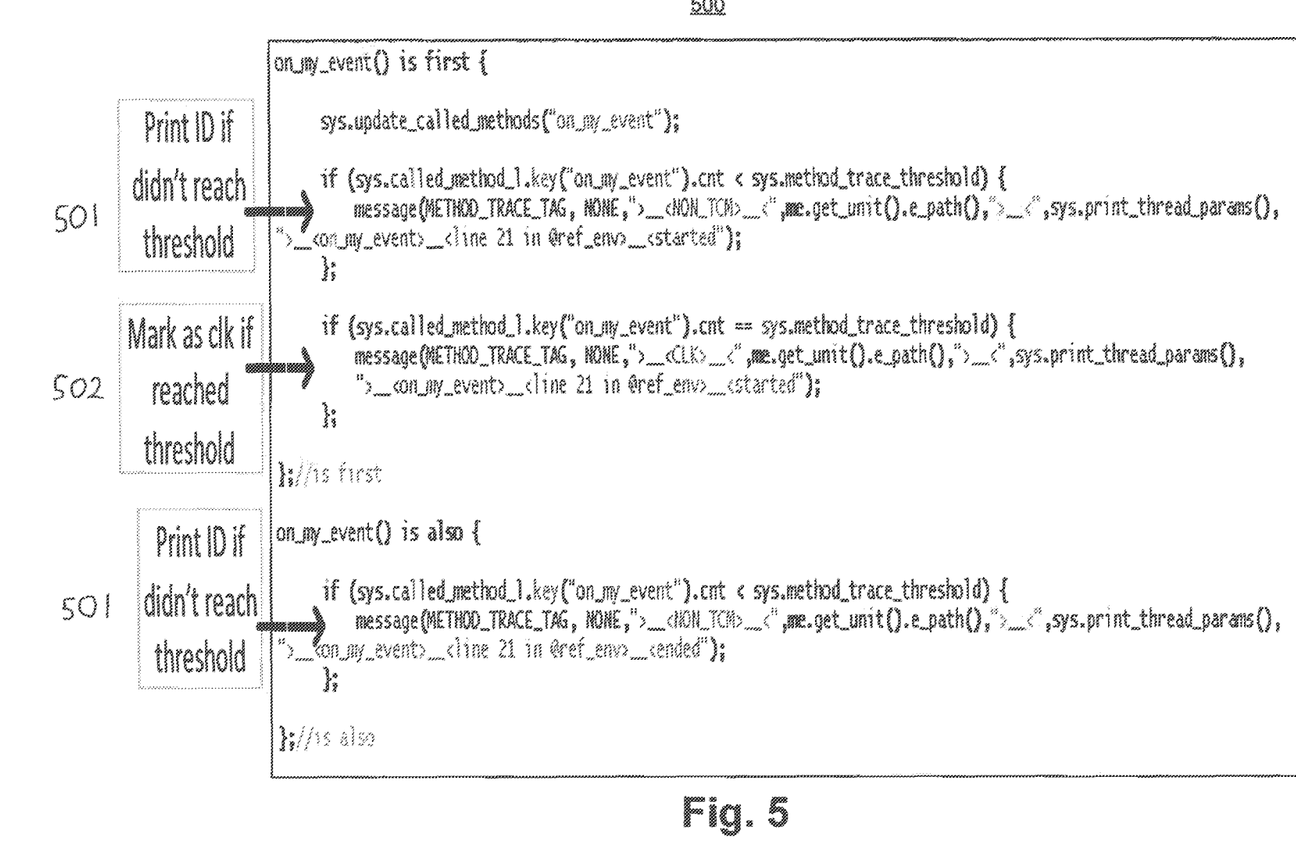
FIG. 5 is an event extension for pre-silicon validation, according to one embodiment.

FIG. 4 is an example 400 of method extension for pre-silicon validation, according to one embodiment. Example 400 illustrates "my_third_message" having message commands to print identifiers (IDs) 401, print input parameters 402, and print result 403. FIG. 5 is an example 500 of event extension for pre-silicon validation, according to one embodiment. In this example, message commands are entered in the "on_my_event" event extension. For example, message commands to; print ID if a threshold was not reached 501, mark as clock if threshold is reached 502, etc.

The overhead, if any, for the extra files and logs to exhaustively debug an HDL program in one run is nominal, according to the embodiments. For example, for a relatively large (about 160,000 lines of code, 3,600 units/structs with over 3,000 extended methods/events) environment analysis, analysis time is less than a minute (depends on the machine), and the final methods_extend.e file is approximately 53,000 lines long (approximately 4 MB).

In one embodiment, not all the methods or structs are extended during analysis. For example, encrypted code (usually found in VIP—Verification IP) may not be extended although the methods are found using reflections. The term "Verification IP" or "VIP" refers to a verification component in the verification environment which is usually bought from a third party company and considered as an IP (Intellectual Property) of the company. It is common in standard busses like USB (Universal Serial Bus), PCI-Ex (Peripheral Component Interconnect Express), etc. the VIP is embedded in the bigger verification environment. It is the same as in RTL (Register Transfer Level) where a USB IP can be bought and put it a Wi-Fi chip. In one embodiment, these extensions are not added (i.e., skipped) to the methods_extend.e file. In one embodiment, events and/or methods which are defined as private may not be extended and are skipped by the pre-silicon validation program. In one embodiment, internal Specman® methods can be extended. However, these limitations can be overcome and additional features can be added to the pre-silicon validation program to access methods which are part of encrypted code, and private method and events, and their associated parameters.

In one embodiment, methods 100 and 200 (and other processes discussed) are executed by a wrapper script. In one embodiment, wrapper script runs a script (e.g., irun) which is a script provided by the vendor (e.g., Cadence®) to run the test with HDL with flags and parameters. In one embodiment, the wrapper script automatically gets parameters from the environment setup (e.g., project information and configuration files), also creates directory for test logs. In one embodiment, the wrapper script generates a command (e.g., an irun command) to execute including flags, parameters, and extension file. In one embodiment, if the methods_extend.e file does not exist, the environment is automatically analyzed and the methods_extend.e file is created. Otherwise, no analysis operation is done. In one embodiment, the methods_extend.e file is added as postloade to the regular run command. The term "postloade" refers to an option of irun to add 'e' file to the compilation at the end (i.e., after the regular 'e' files are loaded). In one embodiment, when running regression, the extension file is generated in pre-session script and added to the compilation. In one embodiment, the environment is analyzed and the extension file is created once per session (a session may have 2,000 tests, for example). In one embodiment, the extension file is added to each test run.

In one embodiment, when running with methods tracer (e.g., method 200) the original logs 105 are not changed. One reason for not changing the original logs 105 is to allow previous tools (e.g., vmmanager by Cadence®) and parsers to continue to operate using the original logs. However, in one embodiment, the original logs 105 may be removed and/or merged as part of the new logs 106. In one embodiment, the extend file creates a new logger (file only logger) which logs all the method extend messages using new dedicated tag. In one embodiment, the effect of large size of the log file 106 is reduced by filtering out events and methods which occur thousands of times during test. For example, an event such as clock, which may not be a very interesting event to trace because it is predictable and regular, can be filtered out. In one embodiment, a configurable maximum occurrences threshold is made available to stop tracing such methods/events when the threshold is reached.

In one embodiment, after the test (i.e., execution of methods 100 and/or 200) is completed or even in the middle of the test run, user can start the debug process. In one embodiment, GUI 107 is used to load the log file 106 to organize the large content of the log file 106. In one embodiment, GUI 107 parses the log file 106 and enables the user to explore the methods and events and their parameters which were called during the test.

Figure 6:
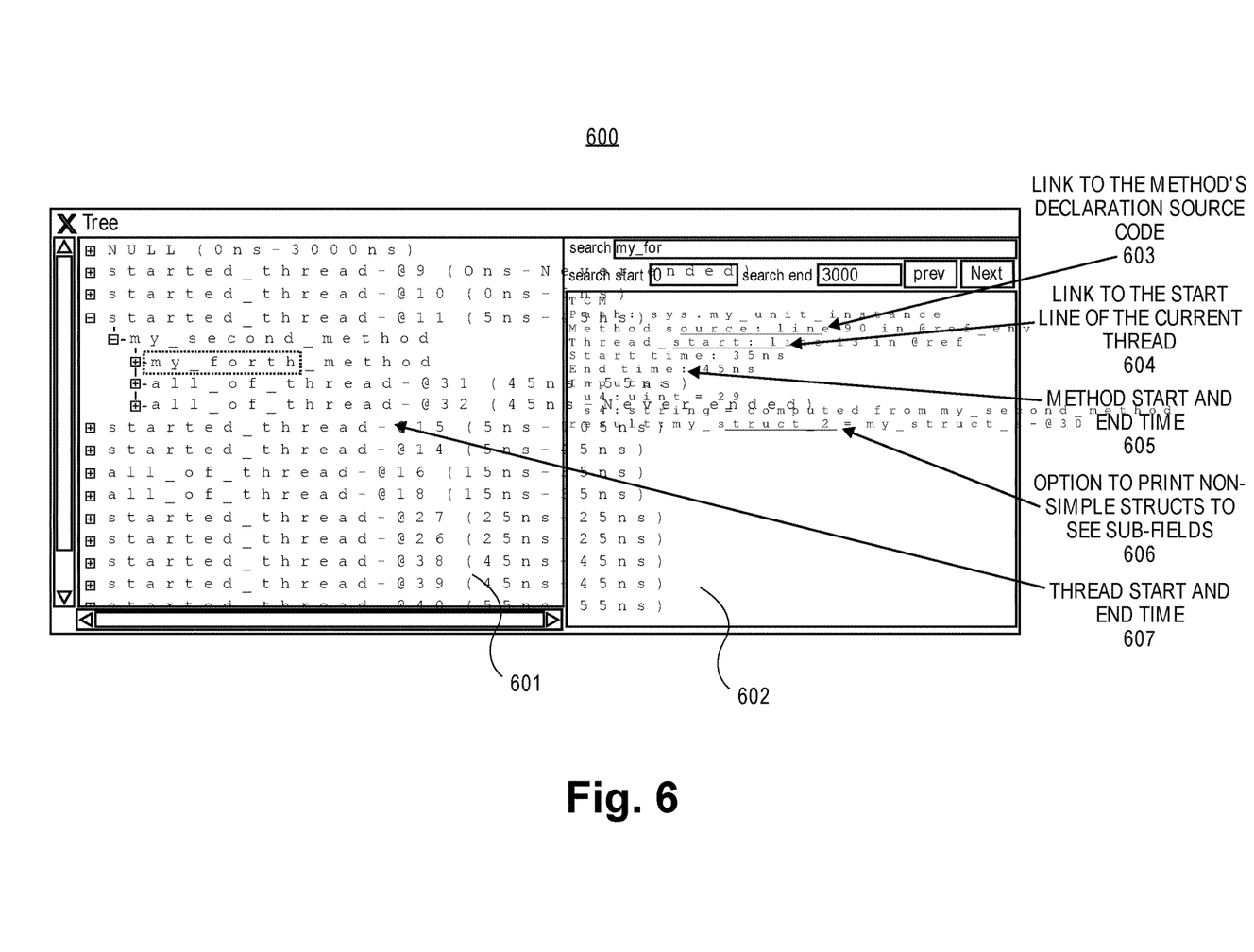
FIG. 6 is a method tracer Graphical User Interface (GUI) for pre-silicon validation, according to one embodiment.

FIG. 6 is a method tracer GUI 600 for pre-silicon validation, according to one embodiment. It is pointed out that those elements of FIG. 6 having the same reference numbers (or names) as the elements of any other figure can operate or function in any manner similar to that described, but are not limited to such.

In one embodiment, GUI 600 comprises a first pane 601 and a second pane 602. In other embodiments, GUI 600 may have fewer or more panes. In one embodiment, GUI 600 is implemented in perl TK (Tickle) script. In another embodiment, the script may be implemented in another programming language. In one embodiment, the script parses the method tracer log 106 and builds a multi-dimensional array of hashes which includes all the collected data on the called methods. In one embodiment, the array of hashes is used to build a GUI tree. In one embodiment, the method tracer log 106 is orthogonal to the regular logs 105 (i.e., complementary to regular logs 105). In one embodiment, parsing is not dependent on Specman® log appearance changes or user defined changes.

In one embodiment, GUI 600 is quick to use because of its pane structure. In one embodiment, GUI 600 displays in first pane 601 full tree of all the started threads in the simulation (including "all of" and "first of" threads). In one embodiment, GUI tree in first pane 601 describes for each thread the methods which ran during the thread in chronologic order. The GUI tree illustrates, for example, each thread is starting at different time in simulation. In this example, the threads are sorted by their starting times. The GUI tree allows a user to easily visualize the flow of the test, the flow of each thread, suspected multiple calls of the same methods, suspected threads/methods which never ended, and DUT (design under test) errors in its context.

In one embodiment, search pane 602 allows the user to find any method/event which occurred during simulation. In search pane 602, user can define the starting time 607 of the method as an additional parameter to the search. In such an embodiment, user can focus on a specific area in the test. In one embodiment, second pane 602 allows the user to view all interesting features and options of a method. For example, line to method's declaration source code 603, link to the start line of the current thread 604, method start and end time 605, option to print non-simple structs to see subfields 606, and/or thread start and end time 607.

Using second pane 602, user can examine all the parameters which were collected on the relevant method. For example, user can determine TCM/Non TCM parameters; full 'e' path; source reference of the method including direct link (without its extensions); direct link to the start of the containing thread; start time and end time 607; input parameters (including option 606 to print non-simple structs and see the subfields); result (including option 606 to print non-simple structs and see the subfields), etc.

Methods 100 and 200 are useful in identifying bugs such as: never ending threads which cause failures in the test; integrity checker methods which are not stopped on reset, and cause false alarms; methods which are called several times instead of once due to bad coding; events races which cause unexpected behavior. The method tracer GUI 600 is useful for many cases including: determining test flow summary using various sequences body( ) trace; finding the source of "out of nowhere" methods; reducing re-runs;

reducing higher verbosity; better understanding of method behavior using easy examination of inputs and results, and sub method call order and hierarchy.

Figure 7:
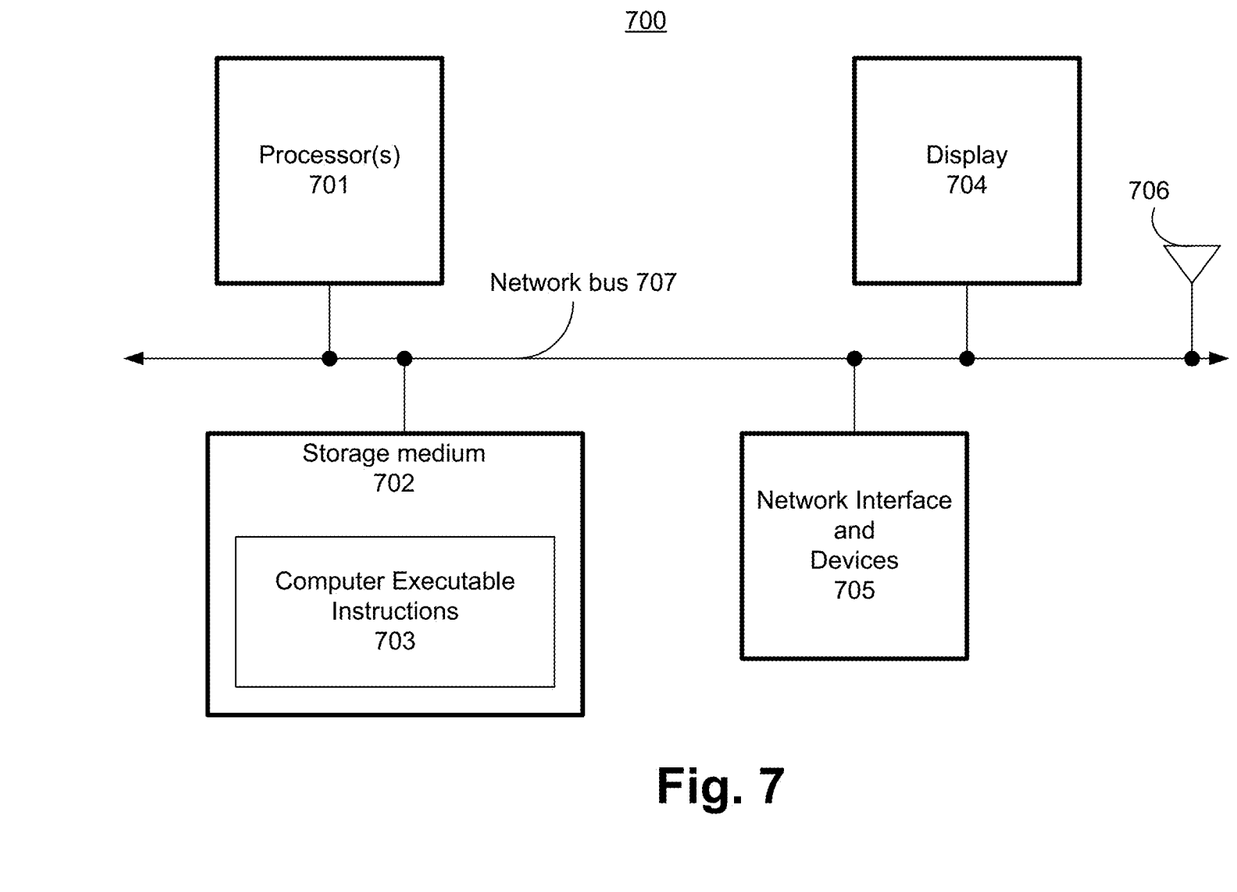
FIG. 7 is a computer system for executing instructions for pre-silicon validation, according to one embodiment.

FIG. 7 is a computer system 700 for executing instructions for pre-silicon validation, according to one embodiment. In one embodiment, computer system 700 comprises processor(s) 701, storage medium 702, computer executable instructions 703, display (e.g., touch screen or non-touch screen) 704, network interface and devices 705, antenna 706, and network bus 707.

In one embodiment, processor 701 can include one or more physical devices, such as microprocessors (e.g., CPUs), application specific processors (e.g., ASICs) microcontrollers, programmable logic devices (e.g., FPGAs), or other processing means. The processing operations performed by processor 701 include the execution of an operating platform or operating system on which applications and/or device functions are executed. The processing operations include operations related to I/O (input/output) with a human user or with other devices, operations related to power management, and/or operations related to connecting the computing device 700 to another device. The processing operations may also include operations related to audio I/O (input-output) and/or display I/O.

In one embodiment, computer system 700 includes audio subsystem (part of devices 705), which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 705, or connected to the network bus 707. In one embodiment, a user interacts with the computing system 700 by providing audio commands that are received and processed by processor 701.

In one embodiment, display unit 704 represents hardware (e.g., display devices) and software (e.g., drivers) components that provide a visual and/or tactile display for a user to interact with the computing device. In one embodiment, display unit 704 includes display interface, which includes the particular screen or hardware device used to provide a display to a user. In one embodiment, display interface includes logic separate from processor 701 to perform at least some processing related to the display. In one embodiment, display unit 704 includes a touch screen device that provides both output and input to a user.

Devices can be attached to the computing system 700 via network bus 707. These devices include microphone devices, speaker or stereo systems, video systems or other display device, keyboard or keypad devices, or other I/O devices for use with specific applications such as card readers or other devices.

Elements of embodiments (e.g., methods 100, 200, and other processes discussed) are also provided as a machine-readable storage medium (e.g., memory 702) for storing the computer-executable instructions 703 (e.g., instructions to implement any other processes discussed herein). The machine-readable storage medium (e.g., memory 702) may include, but is not limited to, flash memory, optical disks, CD-ROMs, DVD ROMs, RAMs, EPROMs, EEPROMs, Phase Change Memory (PCM), magnetic or optical cards, or other type of machine-readable storage media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Program software code/instructions 703 executed to implement embodiments of the disclosed subject matter may be implemented as part of an operating system or a specific application, component, program, object, module, routine, or other sequence of instructions or organization of sequences of instructions referred to as "program software code/instructions," "operating system program software code/instructions," "application program software code/instructions," or simply "software." The program software code/instructions 703 include one or more instructions stored at various times in various tangible memory and storage devices in or peripheral to the computing device, that, when fetched/read and executed by processor 701, cause the computing system 700 to perform functions, functionalities and operations necessary to perform a method, so as to execute elements involving various aspects of the function, functionalities, and operations of the method(s) forming an aspect of the disclosed subject matter.

Machine-readable storage medium is tangible machine-readable storage medium. A tangible machine readable storage medium (e.g., 702) can be used to store program software code/instructions and data that, when executed by a computing device 700, cause the computing device 700 to perform a method(s) as may be recited in one or more accompanying claims directed to the disclosed subject matter. The tangible machine readable storage medium 702 may include storage of the executable software program code/instructions 703 and data in various tangible locations, including for example ROM, volatile RAM, non-volatile memory and/or cache and/or other tangible memory as referenced in the present application. Portions of this program software code/instructions 703 and/or data may be stored in any one of these storage and memory devices. Further, the program software code/instructions 703 can be obtained from other storage, including, e.g., through centralized servers or peer to peer networks and the like, including the Internet. Different portions of the software program code/instructions 703 and data can be obtained at different times and in different communication sessions or in a same communication session.

The software program code/instructions 703 and data can be obtained in their entirety prior to the execution of a respective software program or application by the computing device. Alternatively, portions of the software program code/instructions 703 and data can be obtained dynamically, e.g., just in time, when needed for execution. Alternatively, some combination of these ways of obtaining the software program code/instructions 703 and data may occur, e.g., for different applications, components, programs, objects, modules, routines or other sequences of instructions or organization of sequences of instructions, by way of example. Thus, it is not required that the data and instructions 703 be on a tangible machine readable medium 702 in entirety at a particular instance of time.

Examples of tangible computer-readable media 702 include but are not limited to recordable and non-recordable type media such as volatile and non-volatile memory devices, read only memory (ROM), random access memory (RAM), flash memory devices, floppy and other removable disks, magnetic disk storage media, optical storage media (e.g., Compact Disk Read-Only Memory (CD ROMS), Digital Versatile Disks (DVDs), etc.), among others. The software program code/instructions 703 may be temporarily stored in digital tangible communication links while implementing electrical, optical, acoustical or other forms of propagating signals, such as carrier waves, infrared signals, digital signals, etc. through such tangible communication links.

In general, a tangible machine readable storage medium 702 includes any tangible mechanism that provides (i.e., stores and/or transmits in digital form, e.g., data packets) information in a form accessible by a machine (i.e., a computing device), which may be included, e.g., in a communication device, a computing device, a network device, a personal digital assistant, a manufacturing tool, a mobile communication device, whether or not able to download and run applications and subsidized applications from the communication network, such as the Internet, e.g., an iPhone®, Blackberry® Droid®, or the like, or any other device including a computing device. In one embodiment, computing system 700, is in a form of or included within a PDA, a cellular phone, a notebook computer, a tablet, a game console, a set top box, an embedded system, a TV, a personal desktop computer, etc. Alternatively, the traditional communication applications and subsidized application(s) may be used in some embodiments of the disclosed subject matter.

In one embodiment, antenna 706 provides wireless connectivity to the computer system 700. Wireless connectivity refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, other cellular service standards, non-cellular, personal area networks (such as Bluetooth, Near Field, etc), local area networks (such as Wi-Fi), and/or wide area networks (such as WiMax), or other wireless communication.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

The following examples pertain to further embodiments. Specifics in the examples may be used anywhere in one or more embodiments. All optional features of the apparatus described herein may also be implemented with respect to a method or process.

For example, in one embodiment, a method comprises: analyzing architectural verification environment associated with a hardware description language (HDL) architecture of an integrated circuit; recognizing method calls associated with the architectural verification environment; and generating a list of recognized method calls, the list for being loaded for a debug program to debug the HDL architecture of the integrated circuit.

In one embodiment, recognizing method calls comprises: detecting structs and units declared in the architectural verification environment; and identifying method calls in the detected structs. In one embodiment, recognizing method calls and parameters further comprises: identifying parameters, associated with the method calls, including at least one of: name; input parameters; result type; sampling event; containing thread; start and end time; source code link; or starter. In one embodiment, recognizing method calls and parameters further comprises: generating a file with identified parameters.

In one embodiment, the method further comprises providing a user an option to specify modules, structs, and method calls to be ignored. In one embodiment, the method further comprises executing a graphical user interface (GUI) to load a log file. In one embodiment, the GUI is operable to provide at least one of: a tree of started threads with information about each thread and method call that ran; a visual flow of a test; a flow of each thread that ran; information about multiple calls to a same method; information about threads or method calls that never ended; information about integrity checker methods which did not stop on reset resulting in false alarms; a search pane to find any method or event which occurred during execution of the debug program; or information about parameters of a method call made during execution of the debug program. In one embodiment, the information about parameters of a method call made during execution of the debug program include at least one of: full e-path; source reference of the method call; direct link to start of a thread making the method call; start time; end time; input parameters; or result.

In one embodiment, the integrated circuit is a microprocessor or part of a processor. In one embodiment, the HDL is one of: Verilog; VHDL; Analog HDL (AHDL); Verilog for Analog and Mixed Signal (Verilog-AMS); or VHDL with Analog and Mixed Signal Extension (VHDL-AMS). In one embodiment, the method further comprises recognizing event occurrences associated with the architectural verification environment.

In another example, computer executable storage medium is provided having computer executable instructions that, when executed, cause a processor to perform a method according to the method discussed in the embodiments.

In another example, in one embodiment, a computer system comprises: a memory unit; a processor, coupled to the memory unit, the processor operable to perform a method according to the method discussed in the embodiments; and a display unit to display debug information generated by the processor in a graphical user interface.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. A method of designing an electronic circuit, comprising:
analyzing an architectural verification environment associated with a hardware description language (HDL) architecture of an integrated circuit;
recognizing method calls associated with the architectural verification environment, the method calls having been expressed at a program code level that is higher than a machine instruction level, the recognizing of the method calls including, for at least one method call of the method calls, recognizing each of the following in a single method call:
input parameters of the single method call;
result type of the single method call; and,
start time of the single method call; and
generating, by a computing device, a list of recognized method calls, the list being loaded for a debug program to debug the HDL architecture of the integrated circuit.

2. The method of claim 1, wherein recognizing method calls comprises:
detecting structure and units declared in the architectural verification environment; and
identifying method calls in the detected structure.

3. The method of claim 2, wherein recognizing the method calls further comprises:
identifying parameters, associated with the method calls, including at least one of:
name;
input parameters;
result type;
sampling event; and,
source code link.

4. The method of claim 3, wherein recognizing method calls further comprises:
generating a file with identified parameters.

5. The method of claim 1, further comprising providing a user an option to specify modules, structure, and method calls to be ignored.

6. The method of claim 1, further comprising accepting a user command through a graphical user interface (GUI) to load a log file containing testing information for presentation to the user through the GUI.

7. The method of claim 6, wherein the GUI provides at least one of:
a tree of started threads with information about executed thread and method call;
a visual flow of a test;
a visual flow of an executed thread;
information about multiple calls to a same method;
information about threads or method calls that never ended;
information about integrity checker methods which did not stop on reset resulting in false alarms;
a search pane to find any method or event which occurred during execution of the debug program; or
information about parameters of a method call made during execution of the debug program.

8. The method of claim 7, wherein the information about parameters of a method call made during execution of the debug program include at least one of:
source reference of the method call;
direct link to start of a thread making the method call;
input parameters of the method call; or
result of the method that is called by the method call.

9. The method of claim 1, wherein the integrated circuit is a microprocessor or part of a processor.

10. The method of claim 1, wherein the HDL is one of:
Verilog;
VHDL;
Analog HDL (AHDL);
Verilog for Analog and Mixed Signal (Verilog-AMS); or
VHDL with Analog and Mixed Signal Extension (VHDL-AMS).

11. The method of claim 1, further comprising recognizing event occurrences associated with the architectural verification environment.

12. A computer executable storage medium having computer executable instructions that, when executed, cause a processor to perform a method for designing an electronic circuit, comprising:
analyzing architectural verification environment associated with a hardware description language (HDL) architecture of an integrated circuit;
recognizing method calls associated with the architectural verification environment, the method calls having been expressed at a program code level that is higher than a machine instruction level, the recognizing of the method calls including, for at least one method call of the method calls, recognizing each of the following in a single method call:
input parameters of the single method call;
result type of the single method call; and,
start time of the single method call; and
generating by the processor a list of recognized method calls, the list being loaded for a debug program to debug the HDL architecture of the integrated circuit.

13. The computer executable storage medium of claim 12, wherein recognizing method calls comprises:
detecting structure and units declared in the architectural verification environment; and
identifying method calls in the detected structure.

14. The computer executable storage medium of claim 13, wherein recognizing method calls further comprises:
identifying parameters, associated with the method calls, including at least one of:
name;
input parameters;
result type;
sampling event; and,
source code link.

15. The computer executable storage medium of claim 14, wherein recognizing method calls further comprises:
generating a file with identified parameters.

16. The computer executable storage medium of claim 12, having further computer executable instructions that, when executed, cause the processor to perform a further method comprising:
providing a user an option to specify certain ones of the method calls to be ignored;
accepting a user command through a graphical user interface (GUI) to load a log file containing testing information for presentation to the user through the GUI; and
recognizing event occurrences associated with the architectural verification environment.

17. A computer system for designing an electronic circuit, comprising:
a processor;
a memory unit, the processor coupled to the memory unit, the memory unit having stored therein program code instructions that when executed by the processor cause the computer system to perform a method, the method comprising:

analyzing an architectural verification environment associated with a hardware description language (HDL) architecture of an integrated circuit;

recognizing method calls associated with the architectural verification environment, the method calls having been expressed at a program code level that is higher than a machine instruction level, the recognizing of the method calls including, for at least one method call of the method calls, recognizing each of the following in a single method call:
  input parameters of the single method call;
  result type of the single method call;
  start time of the single method call; and generating a list of recognized method calls, the list being loaded for a debug program to debug the HDL architecture of the integrated circuit; and a display unit to display debug information, generated by the processor, in a graphical user interface (GUI).

18. The computer system of claim 17, wherein the method further comprises:
  providing a user an option to specify modules structure, and method calls to be ignored;
  accepting a user command through the GUI to load a log file containing testing information for presentation to the user through the GUI; and
  recognizing event occurrences associated with the architectural verification environment.

19. The computer system of claim 17, wherein the method further comprises:
  identifying parameters, associated with the method calls, including at least one of:
    name;
    input parameters;
    result type;
    sampling event; and,
    source code link.

20. The computer system of claim 17, wherein the recognizing of method calls further comprises:
  detecting structure and units declared in the architectural verification environment; and
  identifying method calls in the detected structure.

* * * * *